United States Patent
Emanuelsson

(10) Patent No.: US 6,670,674 B2
(45) Date of Patent: Dec. 30, 2003

(54) TRANSISTOR AND POWER AMPLIFIER WITH IMPROVED BANDWIDTH

(75) Inventor: Thomas Emanuelsson, Västra Frölunda (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 10/100,066

(22) Filed: Mar. 19, 2002

(65) Prior Publication Data

US 2002/0135060 A1 Sep. 26, 2002

(30) Foreign Application Priority Data

Mar. 22, 2001 (SE) ................................. 0100992

(51) Int. Cl.[7] .......................... H01L 29/76; H01L 29/80; H01L 23/48; H03F 3/04
(52) U.S. Cl. ..................... 257/343; 257/275; 257/777; 330/250
(58) Field of Search ................. 257/275, 277, 257/343, 500, 501, 684, 702, 777, 778, 528, 31; 330/250

(56) References Cited

U.S. PATENT DOCUMENTS

| 5,485,029 A | 1/1996 | Crabbé et al. ............ 257/501 |
| 5,578,860 A | * 11/1996 | Costa et al. |
| 5,696,466 A | 12/1997 | Li .............................. 330/286 |
| 5,757,074 A | 5/1998 | Matloubian et al. ........ 257/702 |

FOREIGN PATENT DOCUMENTS

| EP | 0 741 413 A2 | 11/1996 | ................. 257/528 |
| JP | 58-106879 | * 6/1983 | ................. 257/31 |

* cited by examiner

*Primary Examiner*—Steven Loke
(74) *Attorney, Agent, or Firm*—Nixon & Vanderhye P.C.

(57) ABSTRACT

The invention relates to an LDMOS transistor including a gate, source and drain, and an earth plane located under the gate, source and drain. According to the invention, the earth plane is given such an extent in the lateral direction of the transistor that an additional component of chip type can be mounted on it, whereby the LDMOS transistor and the additional component of chip type have a shared earth plane. The earth plane suitably comprises a silicon layer which is doped so that it has become conductive and can thereby constitute the earth plane for the transistor and the additional component of chip type.

8 Claims, 2 Drawing Sheets

TRANSISTOR AND POWER AMPLIFIER WITH IMPROVED BANDWIDTH

TECHNICAL FIELD

The present invention relates to a Laterally Diffused Metal Oxide Semiconductor (LDMOS) transistor which can be connected to other devices in such a way that the resulting total device has a high bandwidth and high output power with a small surface area.

BACKGROUND ART

When connecting LDMOS transistors to other circuits, it is of great importance that the transistor can be matched to the impedance of the circuits to which it is connected, for example in order to achieve high power, high efficiency and high linearity. LDMOS transistors are currently constructed as discrete chips that can be matched to the surrounding circuits by means of, for example, matching networks on circuit boards. The connection of the LDMOS transistor to the surrounding circuits is carried out by the use of so-called bonding wires, which severely restricts the bandwidth in the resulting total circuit, depending upon the length of the bonding wires that is required by known technology.

DISCLOSURE OF INVENTION

There is thus a need to be able to match an LDMOS transistor to the impedance of other circuits in a way that does not restrict the bandwidth to the same extent as in previously known solutions.

This need is met by the present invention by providing an LDMOS transistor comprising gate, source and drain, and an earth plane located under these, where the transistor's earth plane has been given such an extent in the lateral direction of the transistor that an additional component of chip type, for example a matching network or a power amplifier, can be mounted on it, arranged in such a way that the LDMOS transistor and the additional component of chip type have a shared earth plane, while at the same time the LDMOS transistor and the other component(s) are so close to each other that the length of the connections does not restrict the bandwidth in the same way as the connections in previously known solutions.

BRIEF DESCRIPTION OF DRAWINGS

The invention will be described in greater detail below, with reference to the following drawings, in which.

MODES FOR CARRYING OUT THE INVENTION

Figure 1:
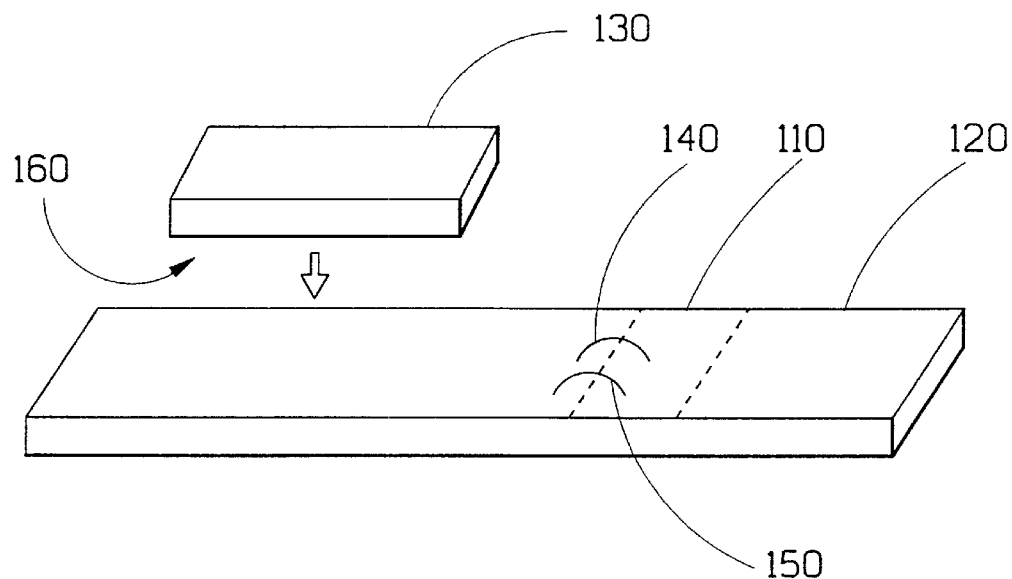
FIG. 1 shows a first embodiment of the invention.

FIG. 1 shows a first way of realizing the invention: An LDMOS transistor 110 is realized in a known way by doping a silicon substrate 120. The LDMOS transistor 110 will comprise source, drain and gate, in addition to an earth plane located below these, which earth plane consists of a part of the silicon substrate in question that has been doped so that it has become conductive and can thereby constitute an earth plane. The part of the substrate that is to constitute the earth plane is suitably but not necessarily doped with boron such that the substrate has a resistance that lies suitably in the range 8–30 mohmcm.

As shown in FIG. 1, the part of the substrate 120 on which the LDMOS transistor has been arranged only comprises a part of the total substrate. According to the invention, the part of the substrate that has been doped in order to constitute the earth plane in the transistor 110 extends beyond what is required for the transistor alone, whereby a space has been created, enabling an additional component 130 to be placed on this extended earth plane. The additional component 130 may be thus mounted on the earth plane created, whenever suitable.

The additional component 130 can already have its own earth plane before it is placed on the substrate 120, which is shown in FIG. 1 by the designation 160, or else the earth plane consisting of the extended substrate 120 can constitute the only earth plane for the component 130.

The component 130 can be attached to the extended earth plane of the substrate in a large number of ways, including gluing with silver epoxy or eutectic bonding. After being attached to the substrate 120, the component 130 and the LDMOS transistor will have a common earth in the earth plane on the substrate, which is advantageous when the component and the transistor are to work together. The additional component 130 is connected to the LDMOS transistor by means of bonding wires 140, 150, but due to the invention, the bonding wires (which can, of course, be more or fewer than two in number, the number shown in FIG. 1 being only an example) can be made considerably shorter than what has previously been possible, which greatly increases the available bandwidth for the resulting combination of transistor and component.

The additional component 130 can of course, in principle, be of any type, but can, for example, be a power amplifier of the Gallium Arsenide (GaAs) type that is suitably implemented in Monolithic Microwave Integrated Circuit (MMIC) technology, or a matching network, or a combination of these.

Figure 2:
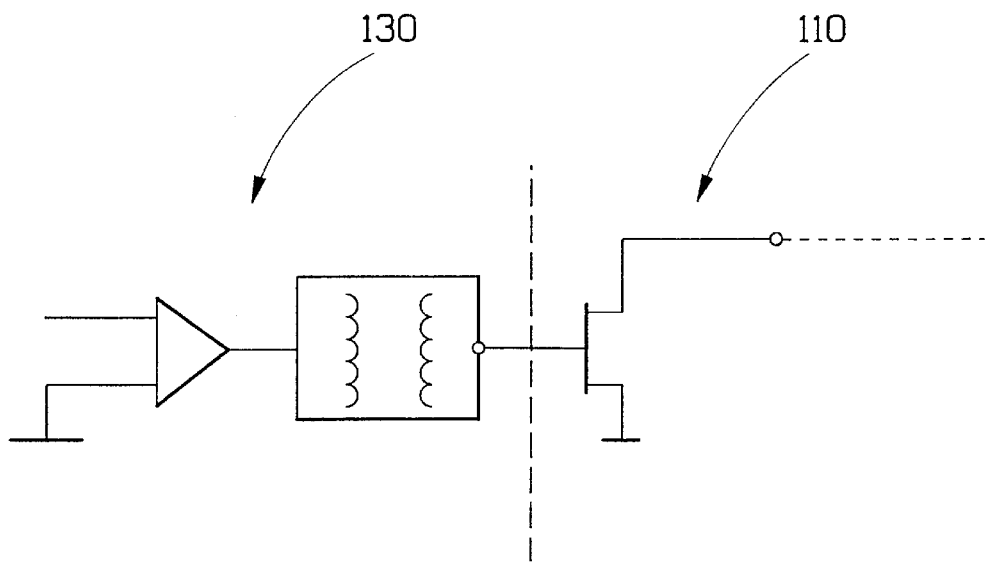
FIG. 2 shows an equivalent circuit diagram for the device in FIG. 1.

FIG. 2 shows an equivalent circuit diagram for the LDMOS transistor 110 and the additional component 130 from FIG. 1, in which the component 130 is shown as an amplifier combined with a matching network. In this case, the additional component is suitably a chip that comprises all the components that are to be connected to the transistor 110. Thus the additional component may be referred to as a component of chip type.

Figure 3:
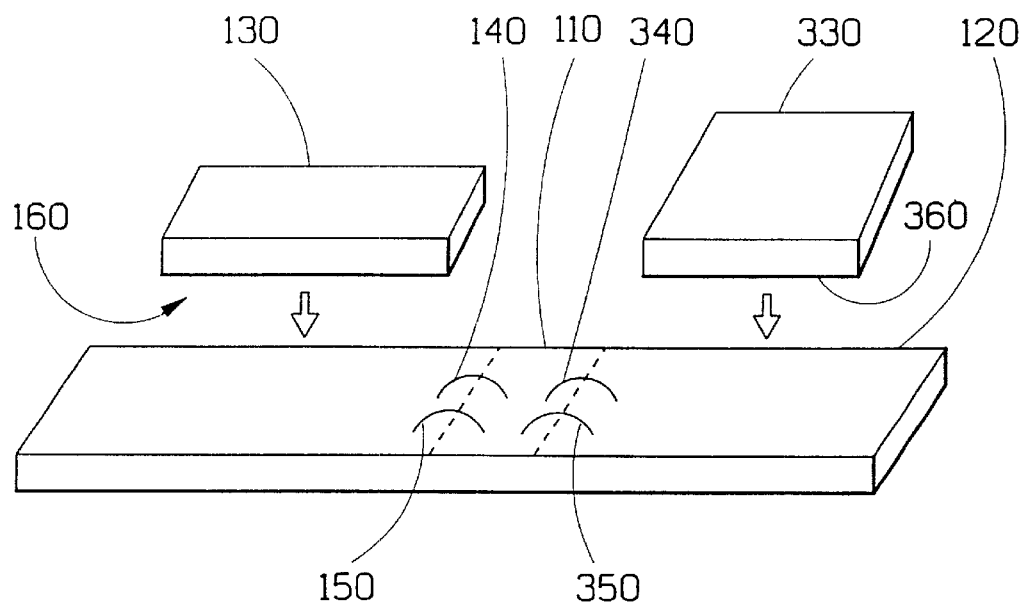
FIG. 3 shows a second embodiment of the invention.

A further variant within the frame of the present invention is that the part of the earth plane of the transistor 110 extending beyond what is actually required for the transistor is given such an extent that it can be used for more than one component in addition to the transistor. Such an embodiment is shown in FIG. 3, where parts that are also included in the embodiment in FIG. 1 have been given the same reference numbers as corresponding parts in FIG. 1. Unlike the embodiment in FIG. 1, however, the "earth plane part" of the substrate 120, in other words the conductive part of the substrate, has been extended so that not only the component 130 can use it as earth plane together with the LDMOS transistor 110, but also an additional second component 330 can utilize the part of the substrate 120 that has been doped to become conductive in order to constitute an earth plane. In other words, the LDMOS transistor 110, the first additional component 130 and the second additional component 330 have thereby a shared earth plane such that they can also be placed close to each other with short connection distances, being suitably connected by bonding wires in accordance with what has been described in connection with FIG. 1. The component 330 is connected to the LDMOS transistor 110 by means of bonding wires 340, 350, which number of bonding wires is only to be regarded as an example. The second component 330 may be thus mounted on the earth plane created, whenever suitable.

Figure 4:
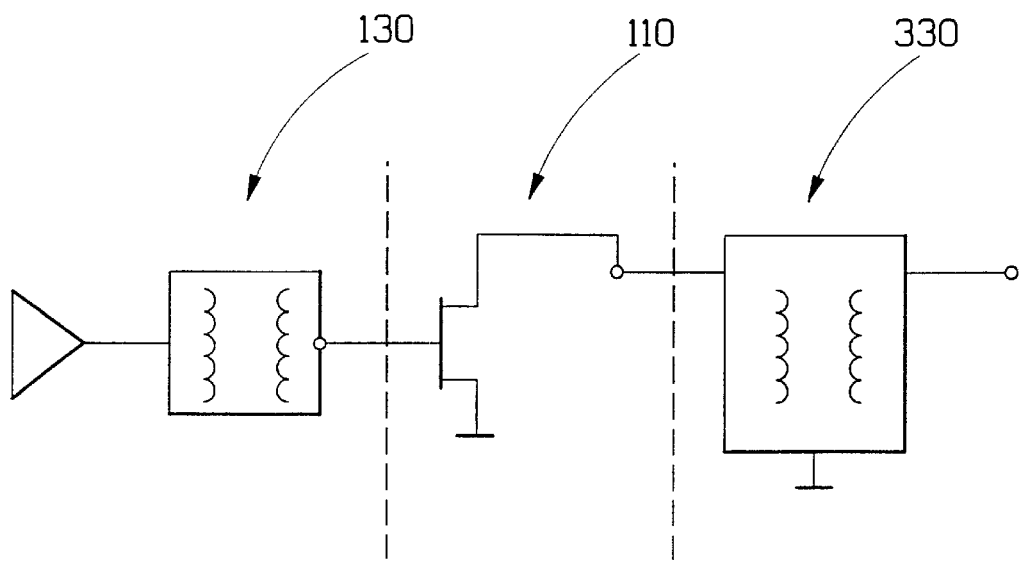
FIG. 4 shows an equivalent circuit diagram for the device in FIG. 3.

As with the first additional component 130, the second additional component 330 can, in principle, be of any type, but can, for example, be a matching network. FIG. 4 shows an equivalent circuit diagram for the embodiment in FIG. 3, where the second additional circuit 330 has been exemplified by a matching network. In this way, by means of the invention, an LDMOS transistor 110 can be connected to an amplifier 130 via a matching network 130 and a matching network 330 on the output of the transistor, the whole of the resulting circuit 130, 110, 330 being able to be realized with a shared earth plane and short connections, whereby a device is obtained that is compact and has a broadband function, fulfilling the aim of the invention.

Both the first and second additional component may be referred to as components of chip type.

What is claimed is:

1. A Laterally Diffused Metal Oxide Semiconductor (LDMOS) transistor comprising:
    a gate, source and drain, and an earth plane located under the gate, source and drain,
    wherein the earth plane has been given such an extent in the lateral direction of the transistor that an additional component of chip type can be mounted on the earth plane, whereby the LDMOS transistor and the additional component of chip type have a shared earth plane; and
    wherein the additional component of chip type comprises a power amplifier including a Gallium Arsenide (GaAs) amplifier.

2. A Laterally Diffused Metal Oxide Semiconductor (LDMOS) transistor according to claim 1, in which the earth plane comprises a silicon layer which is doped so that it has become conductive and can thereby constitute the earth plane for the transistor and the additional component of chip type.

3. An electronic device comprising a Laterally Diffused Metal Oxide Semiconductor (LDMOS) transistor which in turn comprises a gate, source and drain, and an earth plane located under the gate, source and drain, further comprising an additional first component of chip type,
    wherein the transistor's earth plane has been given such an extent in the lateral direction that a first additional component of chip type has been able to be mounted on the earth plane, whereby the Laterally Diffused Metal Oxide Semiconductor (LDMOS) transistor and the first additional component of chip type have a shared earth plane;
    wherein the transistor's earth plane comprises a silicon layer which is doped so that it has become conductive and can thereby constitute the earth plane for the transistor and the first additional component of chip type; and
    wherein the first additional component of chip type consists of a power amplifier comprising a Gallium Arsenide (GaAs) amplifier.

4. An electronic device according to claim 3, further comprising a second additional component of chip type which shares the earth plane with the Laterally Diffused Metal Oxide Semiconductor (LDMOS) transistor and the first additional component of chip type.

5. An electronic device according to claim 4, in which the second additional component of chip type consists of a matching network.

6. A method for manufacturing an electronic device, comprising manufacturing a Laterally Diffused Metal Oxide Semiconductor (LDMOS) transistor with gate, source and drain, and an earth plane located under the gate, source and drain, the method comprising:
    during manufacture the transistor's earth plane is given such an extent in the lateral direction that an additional first component of chip type can be mounted on the transistor's earth plane, whereby the LDMOS transistor and the additional first component of chip type have a shared earth plane; and
    wherein the additional first component of chip type consists of a power amplifier comprising a Gallium Arsenide (GaAs) amplifier.

7. A method according to claim 6, further comprising the mounting of an additional second component of chip type on the earth plane of the Laterally Diffused Metal Oxide Semiconductor (LDMOS) transistor, whereby the second component of chip type shares the earth plane with the Laterally Diffused Metal Oxide Semiconductor (LDMOS) transistor and the first component of chip type.

8. A method according to claim 7, in which the second component of chip type consists of a matching network.

* * * * *